(12) United States Patent
Schrems et al.

(10) Patent No.: US 8,502,308 B2
(45) Date of Patent: Aug. 6, 2013

(54) SEMICONDUCTOR DEVICE WITH A TRENCH ISOLATION AND METHOD OF MANUFACTURING TRENCHES IN A SEMICONDUCTOR BODY

(75) Inventors: Martin Schrems, Eggersdorf (AT); Jong Mun Park, Graz (AT)

(73) Assignee: AMS AG, Unterpremutaetten (AT)

( * ) Notice: Subject to any disclaimer, the term of this patent is extended or adjusted under 35 U.S.C. 154(b) by 574 days.

(21) Appl. No.: 12/304,611

(22) PCT Filed: May 15, 2007

(86) PCT No.: PCT/EP2007/004324
§ 371 (c)(1),
(2), (4) Date: Jan. 21, 2009

(87) PCT Pub. No.: WO2007/144053
PCT Pub. Date: Dec. 21, 2007

(65) Prior Publication Data
US 2009/0273030 A1 Nov. 5, 2009

(30) Foreign Application Priority Data
Jun. 12, 2006 (EP) .................................. 06012076

(51) Int. Cl.
*H01L 27/06* (2006.01)
(52) U.S. Cl.
USPC ........... 257/337; 257/508; 257/510; 257/513; 257/E21.585; 257/E27.011

(58) Field of Classification Search
USPC .......................................... 257/337, 501, 513
See application file for complete search history.

(56) References Cited

U.S. PATENT DOCUMENTS

| | | | | |
|---|---|---|---|---|
| 5,569,949 | A * | 10/1996 | Malhi | 257/397 |
| 6,255,190 | B1 | 7/2001 | Kroner | |
| 6,890,833 | B2 | 5/2005 | Belyansky et al. | |
| 2001/0015470 | A1* | 8/2001 | Gregory | 257/511 |
| 2001/0036705 | A1 | 11/2001 | Nishida et al. | |
| 2004/0018705 | A1 | 1/2004 | Colson et al. | |
| 2005/0127473 | A1* | 6/2005 | Sakagami | 257/510 |
| 2005/0179111 | A1 | 8/2005 | Chao | |
| 2006/0027890 | A1 | 2/2006 | Yang et al. | |
| 2006/0043522 | A1 | 3/2006 | Trivedi | |
| 2007/0054464 | A1* | 3/2007 | Zhang | 438/424 |

FOREIGN PATENT DOCUMENTS
WO    WO 02/25725    3/2002

* cited by examiner

*Primary Examiner* — Minh-Loan T Tran
*Assistant Examiner* — Fazli Erdem
(74) *Attorney, Agent, or Firm* — McDermott Will & Emery LLP (57) ABSTRACT

A low cost integration method for a plurality of deep isolation trenches on the same chip is provided. The trenches have an additional n-type or p-type doped region surrounding the trench—silicon interface. Providing such variations of doping the trench interface is achieved by using implantation masking layers or doped glass films structured by a simple resist mask. By simple layout variation of the top dimension of the trench various trench depths at the same time can be ensured. Using this method, wider trenches will be deeper and smaller trenches will be shallower.

11 Claims, 6 Drawing Sheets

SEMICONDUCTOR DEVICE WITH A TRENCH ISOLATION AND METHOD OF MANUFACTURING TRENCHES IN A SEMICONDUCTOR BODY

RELATED APPLICATIONS

This is a U.S. national stage under 35 USC §371 of application No. PCT/EP2007/004324, filed on May 15, 2007.

This application claims the priority of European patent application no. 06012076.3 filed Jun. 12, 2006 the entire content of which is hereby incorporated by reference.

FIELD OF THE INVENTION

The invention relates to the integration of high voltage and preferably small signal transistors into integrated circuits (IC's) on monocrystalline semiconductor wafers. Isolation between different or neighboured devices on the same chip can be made be arranging isolating trenches and pn junctions therebetween.

BACKGROUND OF THE INVENTION

Isolation of semiconductor devices is also required to minimize leakage currents, to suppress the latch-up with adjacent devices and for minimizing the die size of integrated circuits. Buried layers of dopants are another method of providing device isolation.

In U.S. Pat. No. 6,890,833 B2 one or more isolating trenches arranged in parallel and filled with a dielectric are disclosed. The trenches may have a depth of 600 nm e.g. and an aspect ratio of 6:1. For this type of trench a shallow-trench isolation (STI) can be considered.

Published U.S. patent application US2005/0179111 A1 discloses a CMOS device being isolated against the substrate and neighboured by a buried layer and by a DTI (deep trench isolation). The STI has a depth of typically 5 μm.

Such isolation is traditionally very important (although not limited) to HV devices such as HV transistors operating at Voltages higher than 5V and a power of >1W.

Traditionally HV (High Voltage) semiconductor manufacturing processes and HV transistors have either been developed without buried layers (called HV CMOS) or with buried layer (BCD . . . Bipolar CMOS DMOS). Currently there is no truly modular extension of a HV CMOS process towards a BCD process available.

Key requirement for such a modular extension is that LDMOS High Voltage transistors in the HV CMOS process can be operated also when they are surrounded by an optional buried layer (BL). E.g. for LDMOS (Lateral Double diffused MOS) devices, which have a reverse polarity capability below −50V in a lowly p-doped epitaxial layer, this requires a depth of >20 μm from the surface.

In order to contact the buried layer at such large depths a doped "deep sinker contact" is required. Reducing the isolation distance requires another trench that is deeper than the "deep sinker contact" trench.

SUMMARY OF THE INVENTION

It is therefore an object of this invention to provide such a modular extension of a HVCMOS process while keeping the additional process complexity and thus the manufacturing cost as low as possible.

Another object of this invention is to provide a low cost implementation of a Deep Trench Isolation in combination with a Buried Layer.

Another object of the invention is to provide a truly modular extension of a HV CMOS process toward a BCD process.

These and other objects are attained in accordance with one aspect of the present invention directed to a semiconductor device, comprising a semiconductor body having a surface, a first trench that is arranged at the surface of the semiconductor body, the first trench having a first depth relative to the surface of the semiconductor body; a second trench that is arranged at the surface of the semiconductor body, the second trench having a second depth relative to the surface of the semiconductor body, the second depth being larger than the first depth; a dielectric material filling the first trench and the second trench, and a doped region that is confined to a vicinity of the first trench and is arranged around the first trench in a shape according to the shape of sidewalls of the first trench.

In accordance with an embodiment of the invention, a semiconductor device has a semiconductor body. Near the surface of the semiconductor body at least two different transistors working at different potentials are arranged. A first and a second trench are produced in the semiconductor body having, relative to the surface of the semiconductor body, a first depth d0 and a second depth d2 respectively, where d2>d0. Both trenches are filled with a dielectric material. The first trench is surrounded by a doped region.

The semiconductor body may comprise silicon and silicon/germanium or another semiconductor material used for semiconductor devices comprising transistors. Different types of transistors may be present in the semiconductor device, for example CMOS, NMOS, PMOS, LDMOS, BICMOS or bipolar transistors. The transistors my be operated at different voltages reaching from low voltages up to high and very high voltages, for example up to 200V. The given new trench arrangement in the semiconductor device allows to integrate all those different devices into one production sequence without the need to change the structure of any device structure.

The semiconductor device may comprise a plurality of each type of trenches, which are arranged according to the respective structures of the two different transistors. The second trench is used as a deep trench isolation DTI between different transistors which are to be isolated against each other. The second depth of the DTI may be selected in respect to the voltage applied to one of the transistors to be isolated against each other. Proper depths may be selected between 5 and 25 μm but may also have a lower or even greater depth. HV transistors operating with high voltages reaching for example from 5V up to 200V need the deepest DTI.

The first trenches are surrounded by a doped region and provide a electrically conducting region around the trench which may be used to provide a current conducting path one of the transistors, a contacting plug to connect a buried layer to a terminal on the surface of the semiconductor body, or which may simply be used to provide an isolating pn junction to isolate a transistor against an adjacent device.

Both kind of trenches can be produced in parallel in the same step and both are filled with a dielectric. Thus, the manufacturing of the is easier.

A buried layer may be produced in the surface of a semiconductor substrate by implantation for example. Upon the buried layer an epitaxial layer is produced. The thickness of this layer corresponds to the depth of the buried layer. Thus, the depth of the first trench used to contact the buried layer has to correspond to the depth of the buried layer. Usually the buried layer extends only over a given area of the whole device where an enhanced electrical isolation is needed. The buried layer may comprise a plurality of non-connected areas, each under a transistor or another device structure to be isolated.

The depth of the second trenches used as DTI extends over the depth of the buried layer. Second trenches may completely surround a device structure which may comprise one or more transistors.

The device may comprise a LDMOS transistor using the doped region surrounding the first trench as a drift zone of the transistor. Thus, the first trench may be arranged between the gate and the drain of a LDMOS transistor, the drain contact arranged on top of the doped region around the first trench. In this arrangement the depth of the first trench can be properly selected to correspond to a desired drift zone length which usually corresponds to the operating voltage of the LDMOS transistor. A vertically arranged drift zone helps to reduce the chip area necessary for the LDMOS structure relative to a horizontally oriented drift zone. In this case the conductivity type of the dopant in the doped region of the first trench corresponds to the channel type of the LDMOS. Thus, a n-conducting LDMOS needs a n-doped region at the first trench. Vice versa for a p-conducting LDMOS a respective p-dopant is needed.

The same first trench can be used to provide a drift zone and a contact plug to a buried layer at the same time.

If the first trench is used for isolating a device structure the conductivity type of the dopant in the doped region has to be opposite to the channel type thereby providing an isolating vertically oriented pn junction.

The same first trench can be used to provide a drift zone and a contact plug to a buried layer at the same time. On the other hand a first trench can be used to provide an isolating pn-junction between two device structures and a contact plug to a buried layer at the same time.

The buried layer may be contacted by a special arrangement of three trenches of the same depth arranged in parallel. If the middle one is a first trench surrounded by a doped region, both of the outer third trenches function as a diffusion stop for the dopant in the doped region around the middle/first trench. As a result the dopant concentration is not as much reduced compared to a first trench without a diffusion stopping trench and the conductivity in this region remains high thereby reducing the losses. On the other hand, a diffusion stop limits and reduces the necessary space for the doped region. Thus, the distance between the contacting trench and the adjacent device structure may be reduced.

In another embodiment, a further trench filled with a conducting material may be used to provide a contact to the buried layer. This trench may be etched in the same process step together with the other mentioned trenches present in the semiconductor device.

For manufacturing trenches with different depths parallel in same step a specially structured etch mask is used. First a hard mask which may comprise a sequence of different layers comprising oxide and nitride layers is deposited to the entire surface of the semiconductor body. Then, elongated openings for all the necessary trenches are structured in the hard mask.

An RIE (reactive ion etch) step follows. By using the RIE lag effect a properly selected width of the opening in the hard mask leads to a corresponding trench depths. Thus, different trenches having different depth may be produced by using openings with different widths. The wider the width of the opening the deeper the trench is etched thereby using only one etch step for all different trenches.

In the next step, a dopant is introduced into the sidewalls of the first trenches. Thereafter the sidewalls are lined with a dielectric. A thermal oxide as first layer of the liner is preferred. At least, the trenches may be filled with a dielectric material which may be selected to fill deep trenches having a high aspect ratio greater than 5:1 or exceeding 10:1. A doped glass material doped with phosphorous or boron is preferred for this purpose as it flows at relatively low temperatures filling the trenches without voids.

Alternatively, a sandwich layer of doped and undoped glass is used to fill the trenches to reduce the cost of the deposition process and improve fill properties.

In a later step which may be subsequent or which may be made together with a later manufacturing step producing a necessary thermal budget, the dopant may be diffused deeper into the semiconductor body to produce the doped region around the first trenches.

Introducing the dopant into the sidewall's of the first trench comprises a step of ion implanting the dopant into the sidewalls. Alternatively the dopant may be introduced via a dopant source layer deposited at the sidewalls and a step of diffusing out the dopant by a thermal treatment. Subsequently the dopant source layer may be removed, for example by wet etching.

Introducing the dopant into the sidewalls may comprise two similar steps differing by different dopants to be introduced. Doing this two different first trenches having a doped region of different conductivity type can be produced. In the first step, those first trenches which are to be doped at their sidewalls with a second dopant in a second step are covered with a resist mask shielding those trenches from implantation with the first dopant in the first step.

Using a dopant source layer in the first step needs structuring the source layer to remain only in the areas to be doped. Vice versa the second dopant can be introduced.

The fourth trenches used for providing a special contact plug for the buried layer may be produced as follows:

In step B) fourth openings are structured in the hard mask together with the openings for first and second trenches.

In step C) fourth trenches are etched at the same time and together with the first and second trenches.

The fourth openings are lined with a dielectric,

The lining is removed at a bottom portion of the fourth trenches.

The fourth trenches are filled with a conducting material.

For the conducting material doped poly may be used.

All trench fillings can be made by depositing a filling conducting or dielectric material to the entire surface of the device in a step covering process. The height of the this layer is selected to be at least half time the width of the widest trench to be filled. Subsequently the filling material can be remove from all device areas other than trenches by back etching, CMP or another proper process.

BRIEF DESCRIPTION OF THE DRAWINGS

In the following discussion, various aspects, features and advantages of the present invention will be discussed with reference to the accompanying drawings depicting preferred embodiments of the invention. The figures are only schematics and not drawn to scale.

DETAILED DESCRIPTION OF THE DRAWINGS

FIG. 1 shows a first embodiment of this invention which enables the formation of different trenches preferably filled with oxide or other suitable dielectrics that can optionally be surrounded by a p-doped or an n-doped region at the trench—silicon interface.

The process of trench formation starts with depositing a hard mask onto a semiconductor body, e.g. a silicon wafer, and structuring said mask to provide elongated openings according to the trenches to be produced. The width of the trenches is selected in accordance with the desired depth of the trenches. The wider the opening, the deeper the trench. Etch of trenches is performed in a well known one step RIE process for all trenches at the same time.

Figure 1A:
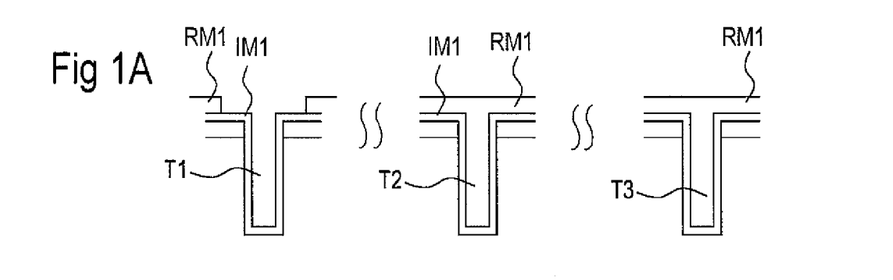
FIG. 1 shows several steps of the formation of isolation trenches via ion implantation.

After removing the hard mask an implantation mask IM is deposited to the entire surface, for example 5 nm LPCVD silicon nitride. A first resist mask RM1 is applied thereon and structured to expose the implantation mask IM in the region of a first trench T1 and to cover the regions of a second trench T2 and a third trench T3. All the trenches T1 to T3 are arranged in different regions of the same semiconductor body as shown in FIG. 1A.

Figure 1B:
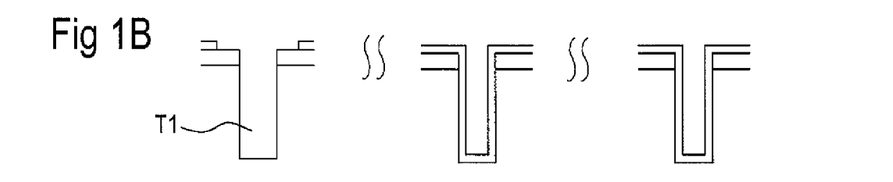

In the next step the exposed implantation mask is etched, e.g. by wet etch using phosphoric acid. FIG. 1B shows the device after stripping the resist mask RM1. In the region of a first trench T1 the implantation mask IM is removed.

Figure 1C:
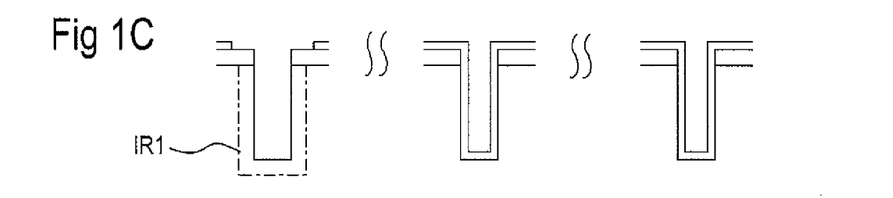

Then, a dopant is introduced into exposed trench sidewalls of first trench T1 either by small angle Ion Implantation (I/I), Plasma doping (PLAD) or PIII (Plasma Immersion Ion Implantation), or Gas Phase Doping to produce a first implanted region IR1. The dopant is of a first conductivity type.

Figure 1D:
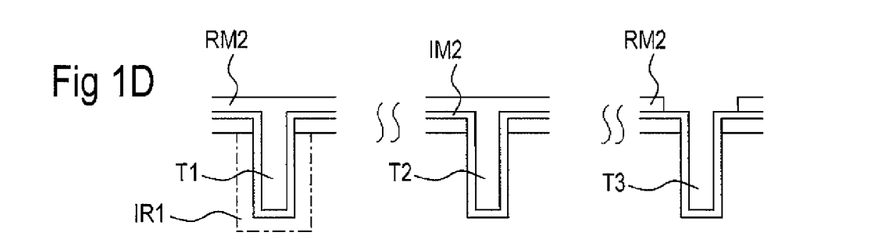
Figure 1E:
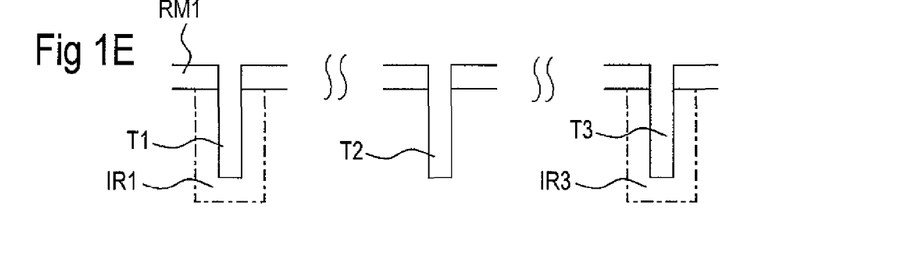

In the next step the first implantation mask IM1 is stripped and a second implantation mask IM2 is deposited and structured as shown in FIG. 1D. Now the region of a third trench T3 is exposed while the other trenches T1, T2 remain covered by the second implantation mask IM2. The already explained steps according to FIGS. 1B and 1C are repeated to result in an arrangement as shown in FIG. 1E. In the sidewalls of the third trench T3 an implanted region IR3 doped with a dopant of a second conductivity type is produced.

Then the sidewalls are sealed by thermal oxidation (e.g. 5-10 nm $SiO_2$). In a subsequent thermal anneal the dopants are introduced deeper into the trench sidewall to produce the doped regions DR1 and DR3 surrounding the first and third trench T1 and T3. This does not have to be a separate process step but can also occur much later in the process utilizing other thermal anneals such as a well drive-in needed for the formation of HV or LV CMOS wells.

Figure 1F:
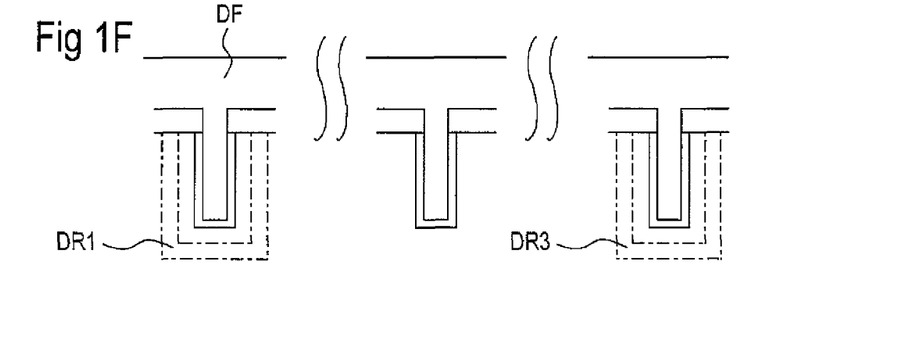

The remaining cavity in the trenches may be filled by depositing a dielectric filling DF as shown in FIG. 1F. The layer extending over the surface of the semiconductor surface may be removed.

Figure 2A:
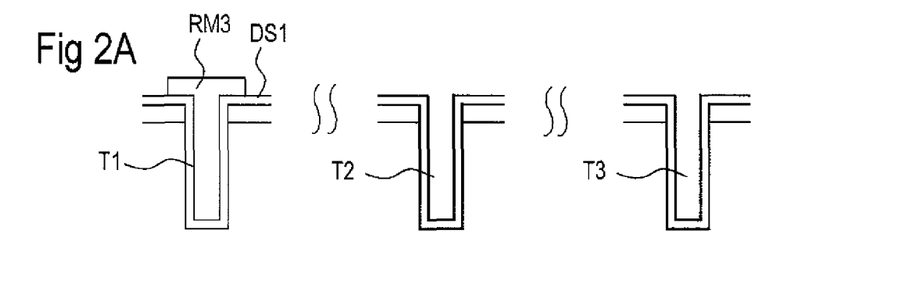
FIG. 2 shows several steps of the formation of isolation trenches via of deposition of doped glass.

FIG. 2 shows, in a second embodiment of the current invention another way to produce different doped regions around the first trenches. Formation of isolating first trenches with optional surrounding p-doped or n-doped region is enabled by deposition of a first dopant source layer DS1 for example doped glass (e.g. BSG for realizing p-doped regions; e.g. ASG or PSG for providing n-doped regions). After deposition the doped glass is structured with a third resist mask RM3 where exposed regions of the dopant source layer DS1 are removed selectively that only those trenches remain covered which are sought to be doped. In FIG. 2A the area of first trench T1 is covered with resist RM3. The glass DS1 can be removed by using isotropic wet or dry chemical etching.

Figure 2B:
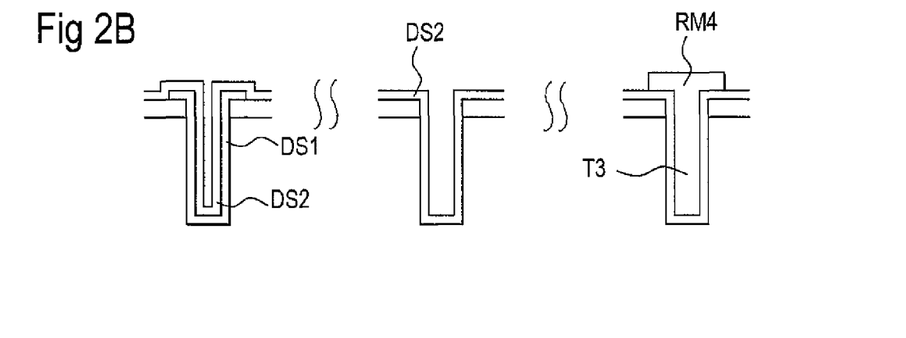
Figure 2C:
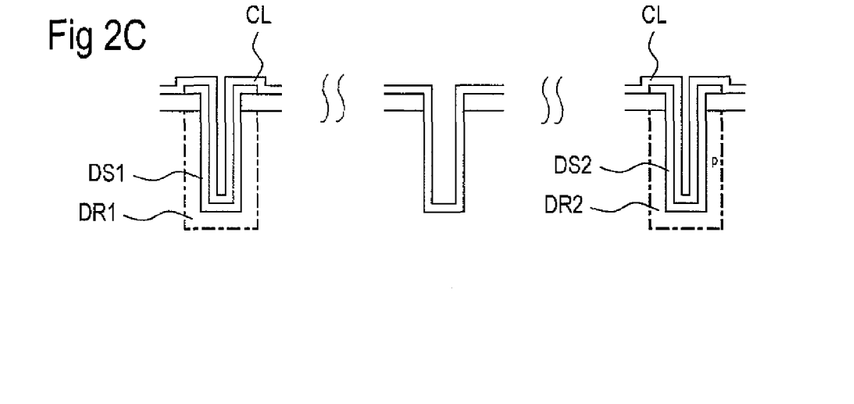

After structuring of the doped glass layer DS1 a second dopant source layer DS2 containing a second dopant deposited and structured with a fourth resist mask RM4. FIG. 2B shows the situation at this point where only the area of third trench T3 is covered with resist RM4. Subsequently exposed second dopant source layer is removed by etching and a cap layer CL (e.g. LPCVD oxide or nitride) is deposited. Then a thermal anneal is performed to drive the dopants from the doped glass into the silicon region surrounding the trenches (see FIG. 2C). A doped region DR1 forms around the first trench T1 and another doped region DR2 of opposite conductivity type (e.g. a p-doped region) forms around the third trench T3. Alternatively other anneals such as a well drive-in which are part of the subsequent CMOS process flow can be used instead.

Figure 3:
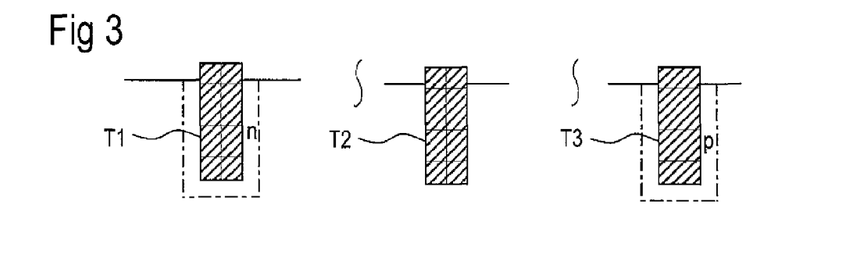
FIG. 3 shows an arrangement of all 3 types of trenches that can be provided by the current invention.

FIG. 3 shows three kinds of different trenches that can be provided by the current invention, after trench fill and recess. Trenches can simultaneously be provided in various depths by varying trench layout parameters such as length and width (not shown). They can be surrounded without (T2) or with a doped region of a first (T1) or second conductivity type (T3).

Figure 4:
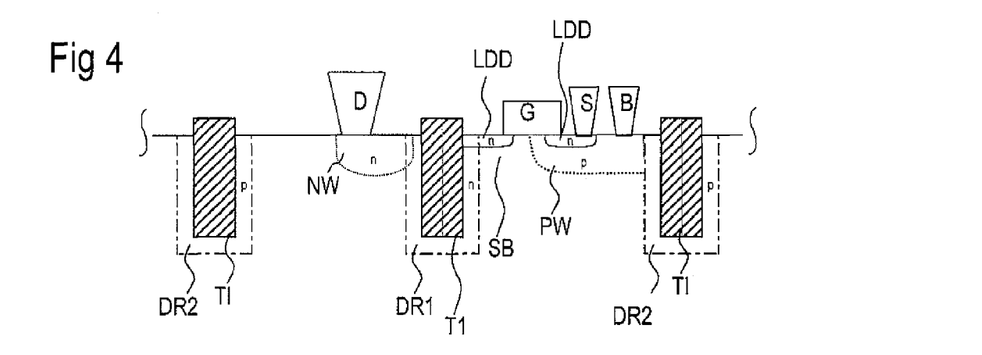
FIG. 4 shows a transistor with vertical drift region and DTI.

FIG. 4 shows an LDMOS transistor with vertical drift region and DTI which may be manufactured using trenches produced as described above. The LDMOS transistor comprises a p-doped body SB, p doped well PW for p-body, a gate structure G and LDD regions LDD. Between drain D and a gate a first trench T1 is located, filled with dielectric and surrounded by a n-doped region DR1 which provides a vertical drift region for the LDMOS. The LDMOS arrangement is surrounded by isolating trenches TI which may be of the first type. The p-doped regions DR2 provide a pn junction relative to the body SB isolating the LDMOS device against other devices of the same or of different type.

Figure 5:
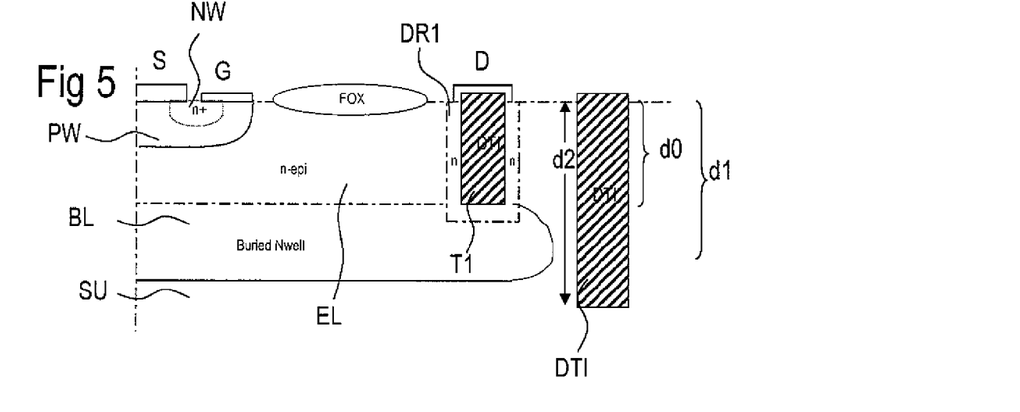
FIG. 5 shows another LDMOS transistor with vertical drift region, DTI and a buried layer.

FIG. 5 shows an LDMOS transistor with a vertical drift region of depth d0, a buried layer BL at a depth d1, a sinker contact to the buried layer BL and a surrounding deep trench isolation DTI of depth d2 with d0<d1<d2. Sinker contact and vertical drift region are provided by the same trench T1 of the first type surrounded by a n-doped region DR1. Because of the n-epi as a drift region, currents flow to the vertical direction (towards buried n-well) and are finally collected at the sinker (vertical DMOS). Between drain D at the right side of the trench T1 and gate G a field oxide region or a shallow trench isolation may be arranged providing a further lateral drift zone to support high blocking voltage.

The n-doped buried layer EL is arranged between a p-doped substrate SU and an n-doped epitaxial layer EL. A p-doped well PW provides the body of the LDMOS. Under the source a n-doped well NW is arranged.

The deep trench isolation DTI isolating the LDMOS against other adjacent devices of the same or of different type is realized by a trench of the second type without a surrounding doped region. DTI and first trench are manufactured in the same process as described above.

Figure 6:
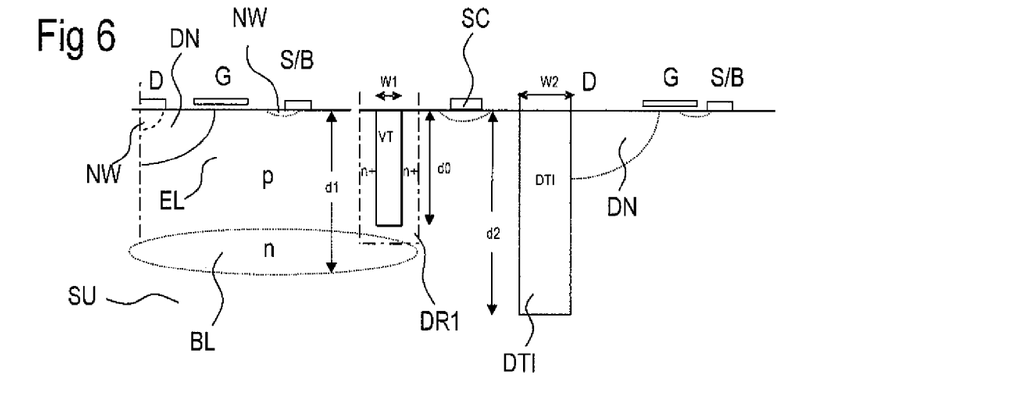
FIG. 6 shows an LDMOS structure with DTI, a first trench forming a sinker contact and a buried layer.

FIG. 6 shows an LDMOS structure with a sinker contact to a buried layer of depth d1 and surrounding DTI of depth d2 with d1<d2. Drain D is arranged over a deep n-well DN. Drain D and source S are arranged over a n-well NW respectively. Source S can additionally function as a body contact B contacting the body formed of a p-doped epitaxial layer EL. The source and body contact together are shown as SIB on FIG. 6. The horizontal drift zone is located in the deep n-well DN. Adjacent to the deep trench isolation DTI, formed by a trench of the second type without surrounding doped region, a further LDMOS or any other type of transistor may follow well isolated from the LDMOS by DTI as shown on the right side of FIG. 6.

Figure 7:
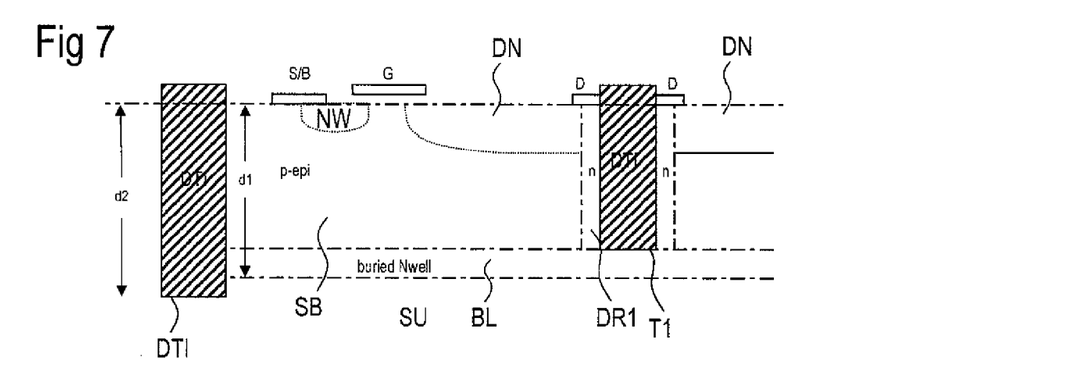
FIG. 7 shows another LDMOS structure with DTI, a first trench forming a sinker contact and buried layer.

FIG. 7 shows another embodiment of a first LDMOS structure with a sinker contact to a buried layer of depth d1 and surrounding DTI of depth d2 with d1<d2. The buried layer is bisected by the deep trench isolation DTI. The sinker contact is formed by a first type trench T1 surrounded by a n-doped region DR1 which is in contact with the drain D. A deep n-well DN forming the drift region of the first LDMOS is also divided by the trench T1. Combined source and body contact S/B overlaps a n-well NW. Gate G arranged between source S and drain D overlaps the n-well NW, the deep n-well DN and a body area. Body SB is formed by a p-doped epitaxial layer separated from the substrate SU by the buried layer BL. Trench T1 forms a symmetry axis for a subsequent second LDMOS also using the n-doped region DR1 as drain.

Figure 8:
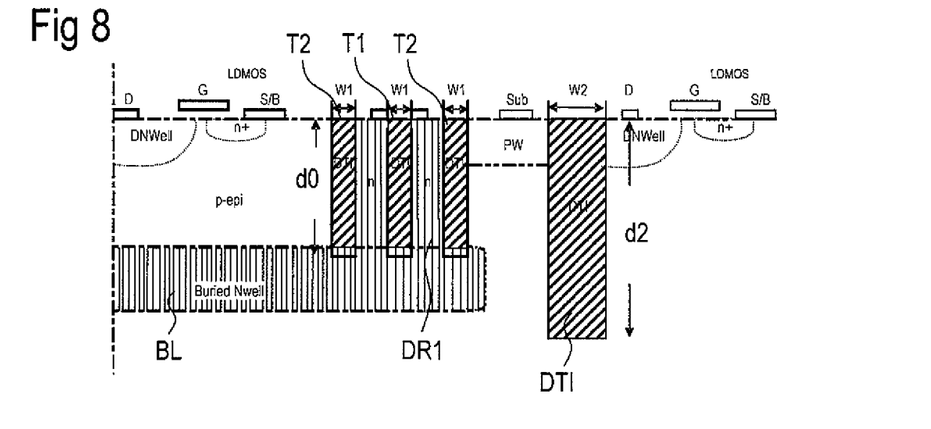
FIG. 8 shows a LDMOS structure with trenches, which help to prevent out-diffusion of a trench sinker.

FIG. 8 shows another embodiment of a LDMOS structure having an isolated sinker contact zone to contact the buried layer BL under the LDMOS. The sinker contact is formed by a first type trench T1 surrounded by a n-doped region DR1. Adjacent to that region on both sides of the first type trench T1 are arranged isolating trenches T2 filled with dielectric. During manufacturing of the three trench assembly while driving out the dopant out of the side walls of the first trench T1 both of the neighbouring trenches work as diffusion stop, limiting the extension of the doped region DR1 and isolating same. The LDMOS realized above the buried layer BL besides the isolated contact sinker is thus well isolated. A further deep trench isolation DTI is located beside the buried layer and the contact sinker. A substrate contact Sub is arranged above a p-well PW between contact sinker and DTI. Right hand of the DTI a further transistor e.g. a LDMOS follows which may be isolated against substrate by a further buried layer or not depending on the operating voltage. The depths of the two trenches is controlled by a width W1 of first and second type trenches T1, T2 and a width W2 of DTI where W1<W2 resulting in a depth d2>d0.

It can be shown by simulation calculation that a buried layer and a sinker contact as shown in FIG. 6, for example, are a good isolation of transistor devices from the substrate even at reversed polarity such that a punch through will not occur at voltages up to −66V where VD=VS=66 V and the substrate is biased (ground).

Figure 9:
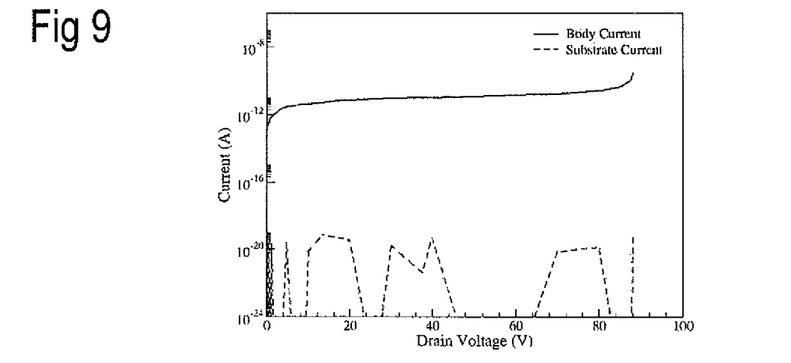
FIG. 9 shows a simulation of leakage currents of the embodiment of FIG. 6.

FIG. 9 shows calculated leakage currents at body (continuous line) and substrate contact for different positive biased voltages. The diagram clearly shows that a punch-through does not appear in the range of the drain voltage below 90V and substantiates the low substrate-current capabilities of the structure according to FIG. 6.

Figure 10:
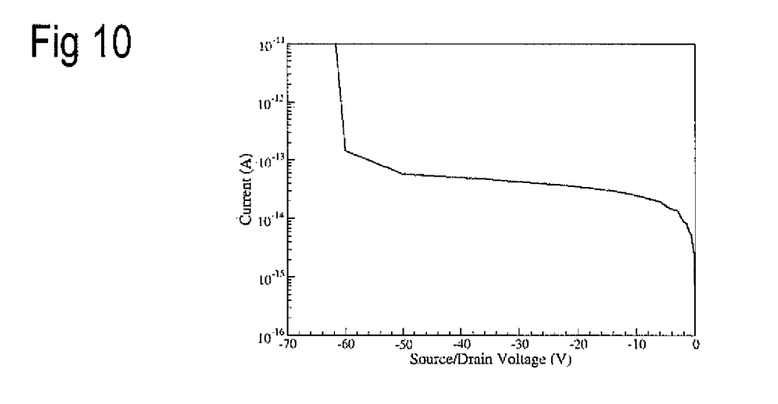
FIG. 10 shows a simulation of leakage currents of that embodiment with an applied voltage of reverse polarity.

FIG. 10 is a similar diagram for a below substrate voltage operation where VS=VD<0V relative to substrate (VS=0). It shows that a punch through does not appear until −60V. At positive and reverse bias voltages from zero to punch through the leakage current rises only with a very small amount.

The further deep trench isolation DTI results in a better isolation between device neighboured in the semiconductor body. A n-well for example operating with high potentials does not lead to a punch through to the transistor isolated by a buried n-layer and a sinker contact but result in a current flowing to the buried layer.

Figure 11:
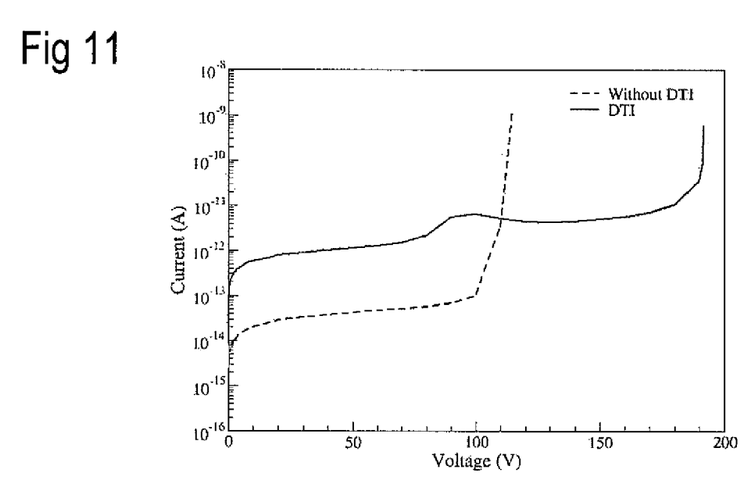
FIG. 11 shows the positive effect of a deep trench isolation.

The positive effect of a deep trench isolation DTI on the isolation of a transistor is shown in FIG. 11. The first curve (continuous line) shows the leakage current for a device with deep trench isolation DTI compared to the leakage current for a device without DTI (doted line). The isolation in the first case is improved relative to the second case for more than 90 V.

As the invention has been explained by few embodiments only it is not restricted to same. It is clear that the inventive trench combinations can be used to isolate any kind of transistor device realized in a given semiconductor body of any semiconductor material or any conductivity type. All dopings in the examples can be reversed without deviating from the invention and its superior isolating properties.

The invention claimed is:

1. A semiconductor device, comprising:
   a semiconductor body having a surface,
   a first trench that is arranged at the surface of the semiconductor body, the first trench having a first depth relative to the surface of the semiconductor body;
   a second trench that is arranged at the surface of the semiconductor body, the second trench having a second depth relative to the surface of the semiconductor body, the second depth being larger than the first depth;
   a dielectric material filling the first trench and the second trench; and
   a doped region that is confined to a vicinity of the first trench and is arranged surroundingly around the first trench in a shape according to the shape of sidewalls of the first trench.

2. The semiconductor device of claim 1, further comprising:
   a buried layer located at a distance from the surface of the semiconductor body, the distance corresponding to the first depth; and
   the doped region providing an electric connection between the surface of the semiconductor body and the buried layer.

3. The semiconductor device of claim 1, wherein the buried layer is bisected by a deep trench isolation that is provided by the second trench.

4. The semiconductor device of claim 1, further comprising:
   a first transistor comprising a high voltage transistor;
   a second transistor that is different from the first transistor;
   wherein the first transistor and the second transistor are arranged in the semiconductor body; and
   wherein the second trench provides a deep trench isolation between the first transistor and the second transistor.

5. The semiconductor device of claim 1, further comprising:
   a plurality of first trenches each surrounded by doped regions;
   wherein at least one trench of the plurality of first trenches is surrounded by a doped region of a conductivity type that is different from the conductivity type of another trench of the plurality of first trenches.

6. The semiconductor device of one of claim 1, further comprising:
   a lateral double defused metal oxide semiconductor (LDMOS) transistor using the doped region surrounding the first trench as a drift zone of the LDMOS transistor.

7. The semiconductor device of claim 1, further comprising:
- a lateral double defused metal oxide semiconductor (LDMOS) transistor of a first channel type which uses the doped region surrounding the first trench as a drift zone of the LDMOS transistor; and
- a further first trench, surrounded by a doped region of a conductivity type opposite to the channel type, the further first trench being arranged adjacent to the LDMOS transistor and isolating the LDMOS transistor from a neighboring transistor of a same or a different type.

8. The semiconductor device of claim 1, further comprising:
- two third trenches filled with a dielectric;
- wherein the first trench is arranged between the third trenches;
- wherein the third trenches have a same depth as the first trench; and
- wherein the third trenches confine the doped region of the first trench.

9. The semiconductor device of claim 1, further comprising:
- a fourth trench, lined with a dielectric, filled with a conducting material, and having a same depth as the first depth; and
- wherein the conducting material provides a contacting connection of the surface of the semiconductor body and the buried layer.

10. The semiconductor device of claim 1, wherein the semiconductor body comprises a buried layer having a limited area and arranged in a depth that is smaller than the second depth;
- wherein a transistor is arranged in the semiconductor body above the buried layer;
- wherein the first trench provides an electric connection between the surface of the semiconductor body and an edge of the buried layer;
- wherein the second trench having the second depth is arranged adjacent to the buried layer; and
- wherein a substrate contact is arranged at the surface of the semiconductor body between the first and second trench.

11. A semiconductor device, comprising:
- a semiconductor body having a surface,
- a first trench arranged at the surface of the semiconductor body, the first trench having a first depth relative to the surface of the semiconductor body;
- a second trench that is arranged at the surface of the semiconductor body, the second trench having a second depth relative to the surface of the semiconductor body, the second depth being larger than the first depth;
- a dielectric material filling the first trench and the second trench;
- a doped region that is confined to a vicinity of the first trench and is arranged surroundingly around the first trench in a shape according to the shape of sidewalls of the first trench; and
- a buried layer located at a distance from the surface of the semiconductor body, the distance corresponding to the first depth;
- wherein the doped region provides an electric connection between the surface of the semiconductor body and the buried layer and the first trench surrounded by the doped region is located above the buried layer.

* * * * *